United States Patent [19]

Peterson

[11] Patent Number: 5,740,605
[45] Date of Patent: Apr. 21, 1998

[54] BONDED Z-AXIS INTERFACE

[75] Inventor: Robert K. Peterson, Garland, Tex.

[73] Assignee: Texas Instruments Incorporated, Dallas, Tex.

[21] Appl. No.: 685,888

[22] Filed: Jul. 25, 1996

[51] Int. Cl.$^6$ .............................. H05K 3/42; H05K 3/36; H05K 3/46
[52] U.S. Cl. .................... 29/840; 29/848; 29/853
[58] Field of Search ................ 29/848, 840, 832, 29/846, 852, 853

[56] References Cited

U.S. PATENT DOCUMENTS

| | | | |
|---|---|---|---|
| 3,392,442 | 7/1968 | Napier et al. | 29/840 |
| 3,429,040 | 2/1969 | Miller | 29/840 |
| 3,436,818 | 4/1969 | Merrin et al. | 29/840 |
| 4,221,047 | 9/1980 | Narken et al. | 29/840 |
| 5,203,075 | 4/1993 | Angulas et al. | 29/840 X |
| 5,255,431 | 10/1993 | Burdick | 29/840 |
| 5,341,564 | 8/1994 | Akhavain et al. | 29/840 X |
| 5,361,491 | 11/1994 | Oomachi et al. | 29/840 X |

*Primary Examiner*—Horace M. Culver
*Attorney, Agent, or Firm*—Rene' E. Grossman; Richard L. Donaldson

[57] ABSTRACT

A method of forming a z-axis interface with a device having a first electrically conductive pad thereon wherein a layer of resilient electrically insulating material, capable of being made rigid, preferably a thermoplastic polymer or a b-stage thermosetting polymer, is formed over the first pad. A via is then formed in the electrically insulating material extending to the first pad. A layer of electrically conductive material, preferably gold, is then formed on the sidewalls extending to the pad and out of the via. A second electrically conductive pad is then applied under pressure to the electrically conductive material extending out of the via to deform the electrically conductive material into the resilient electrically insulating material. The electrically insulating material is then caused to become rigid. In accordance with a second embodiment, a free standing interconnect structure is provided by providing a removable base, forming a patterned electrically conductive layer on the base, forming a layer of resilient electrically insulating material, capable of being made rigid, and having a via with sidewalls extending therethrough secured to the electrically conductive layer, forming a layer of electrically conductive material on the sidewalls extending out of the via and over the electrically insulating material and removing the removable base.

20 Claims, 1 Drawing Sheet

U.S. Patent  Apr. 21, 1998  5,740,605
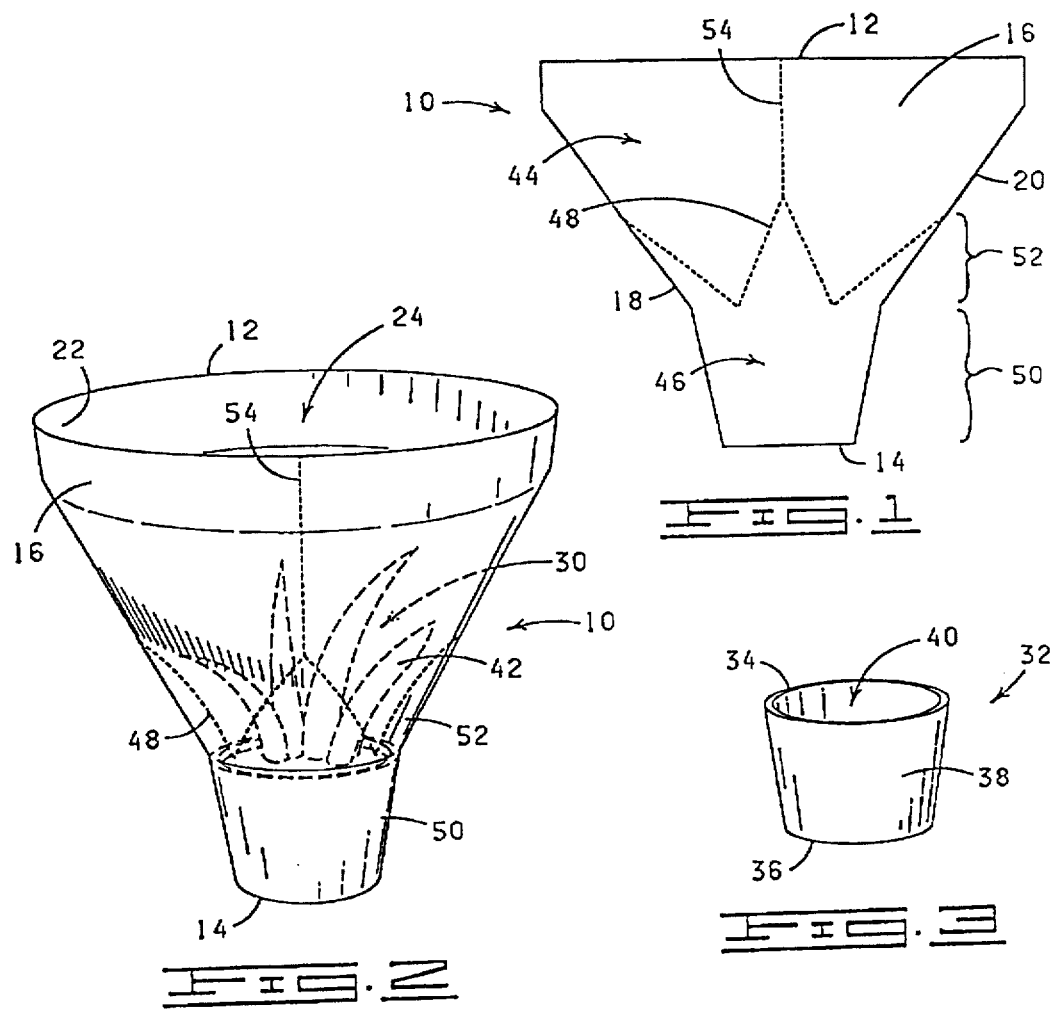
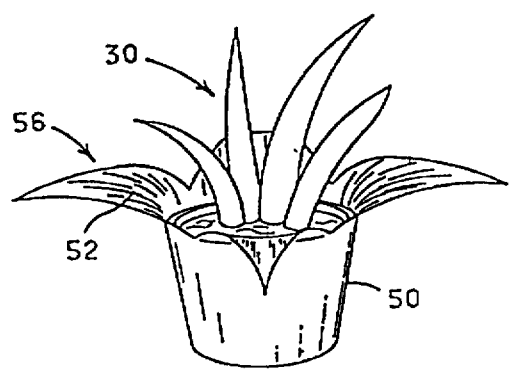
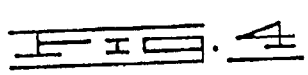
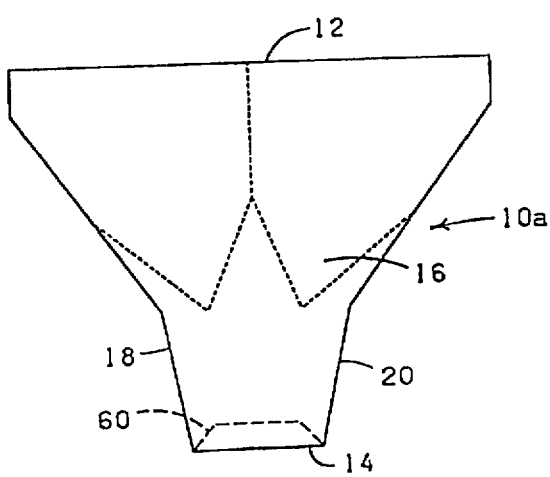

BONDED Z-AXIS INTERFACE

BACKGROUND OF THE INVENTION

1. Field of the Invention

This invention relates to a direct vertical interconnect of integrated circuit devices and fineline circuits with minimization of processing steps.

2. Brief Description of the Prior Art

Z-axis or vertical connection between plural integrated circuit devices, integrated circuit devices and other structures and fineline structures in general have been provided in the prior art by the use of z-axis films with a uniform distribution of electrically conductive particles. These films are generally referred to as z-axis adhesives and typically are single ball films having a plurality of spaced apart metallic balls distributed therein. When the surfaces of the adhesive are pressed together, the adhesive becomes electrically conductive due to contact of the electrically conductive balls to provide an electrical interconnect. With uniform metallic fill, RF interference becomes a problem for microwave applications. Common films are about 50 microns thick and have a grid resolution of about 200 microns. In some cases the metallic balls have been replaced by elastomer IC balls which are plated with an electrically conductive material so that the balls become collapsible. Other such systems have localized regions of electrically conductive particles separated by a resin. None of these z-axis adhesives require film orientation to make proper interconnection. These z-axis adhesives do not operate well between two rigid parts. It is therefore apparent that a z-axis interface with improved properties is highly desirable.

SUMMARY OF THE INVENTION

In accordance with a first embodiment of the present invention, there is provided a z-axis interface which can be fabricated with thin film processing steps as opposed to the prior art, thereby providing a feature size advantage, the z-axis interface also providing resiliency to minimize the existence of voids at the bondline. The interface can provide a uniform or custom pattern, the custom pattern having a microwave advantage. The interface can be manufactured on one or the other of circuit surfaces or can be manufactured as a free standing film.

Briefly, the above is accomplished by depositing, such as, for example, by spinning, a layer of one of an electrically insulating b-stage polymer (incompletely cross-linked), such as, for example, epoxy or a thermoplastic material, such as, for example, butadiene which displays resilience over the pads to which connection is to be made and, if desired, all or any predetermined portions of the underlying structure containing the pads. The structure can be, for example, an integrated circuit or printed wiring circuit. Single or multiple vias, preferably with sloping sidewalls are then formed in the layer, such as, for example, by reactive ion etching (RIE) holes which extend to the pads. A layer of electrically conductive material, preferably gold, is then formed, preferably by plating or vacuum deposition, over the via sidewalls to the pad and extends out of the via to provide a small lip on the surface of the electrically insulating material. The electrically conductive layer can also extend along the surface of the electrically insulating layer and form an interconnect, an electrically conductive pattern 65 or the like. The shape of the electrically conductive material can vary.

To make an interconnection, a mating pad, such as, for example, a pad on an integrated circuit, is now aligned for custom patterning or overlayed for uniform patterns with the via and the electrically conductive material extending out of the via and then bonded to the electrically conductive material under pressure. This is accomplished by first placing the mating pad against the small lip of the electrically conductive material on the surface of the electrically insulating material under pressure so as to deform the electrically conductive material into the resilient electrically insulating material. The electrically conductive material is collapsed into the electrically insulating layer to create a continuous bond line with no voids due to the resilient property of the electrically insulating layer. The resilient electrically insulating material is then hardened or made rigid by, for example, cooling if the electrically insulating material is thermoplastic or heating to complete cross-linking if the electrically insulating material is a b-stage polymer. This creates an electrical, structural and environmental interface.

As a second embodiment of the invention, an underlying base of a removable material, preferably silicon, is provided which can optionally have contact pads thereon. An electrically conductive film, preferably gold, is then deposited over the base, patterned and etched to provide an electrically conductive pattern which is also bonded to the contact pads, if present. The procedure now continues as in the first embodiment with depositing, such as, for example, by spinning, a layer of one of an electrically insulating b-stage polymer or a thermoplastic material which displays resilience over the pads and electrically conductive film to which connection is to be made and, if desired, all or any predetermined portions of the underlying structure containing the pads. Single or multiple vias, preferably with sloping sidewalls are then formed in the layer, which extend to the pads. A layer of electrically conductive material, preferably gold, is then formed over the via sidewalls to the pad and extends out of the via to provide a small lip on the surface of the electrically insulating material. The electrically conductive layer can also extend along the surface of the electrically insulating layer and form an interconnect, an electrically conductive pattern or the like. The shape of the electrically conductive material can vary. The base is then removed, such as by etching in the case of a silicon base with the pad, if present, patterned gold layer and resilient electrically insulating layer with vias and via conductors therein to provide a free-standing structure. This free-standing structure can then be secured to a printed wiring board, integrated circuit or the like with processing continuing by application of a device under pressure as in the first embodiment.

DESCRIPTION OF THE PREFERRED EMBODIMENT

Figure 1:
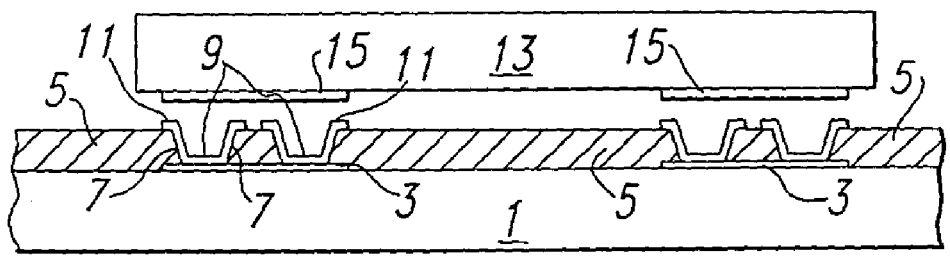
FIG. 1 is a schematic drawing of the structural elements for providing a z-axis connection to be made in accordance with the present invention.
Figure 2:
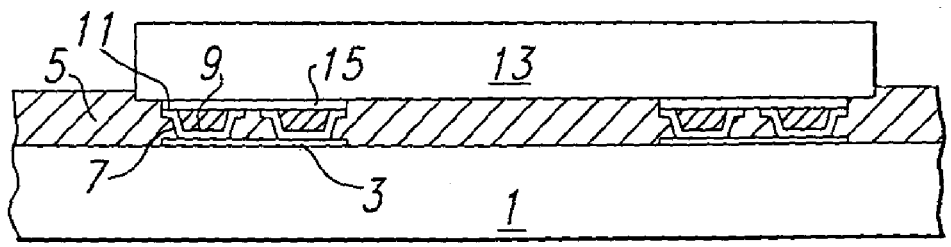
FIG. 2 is a schematic drawing of the z-axis connection made from the structural elements depicted in FIG. 1.

Referring first to FIG. 1, there is shown the structural arrangement for providing a z-axis connection or interface in accordance with the present invention. There is shown an underlying base 1 in the form of a printed wiring circuit having pads 3 onto which a layer of resilient, electrically insulating material 5 in the form of a b-stage polymer, preferably butadiene has been spun. The polymer is allowed to sit or is otherwise treated until it becomes somewhat rigid, but still retains resiliency and is still b-stage. An electrically conductive pattern (not shown) can then optionally be deposited, such as, for example, by evaporation, on the surface of the electrically insulating material 5. Vias are then formed through the electrically insulating material 5 to the pads 3, by reactive ion etching (RIE), the vias preferably having sloping sidewalls 7 and electrically conductive material 9, preferably gold, is then plated along the sidewalls 7 to the pad 3 and over the electrically insulating material 5 to provide a lip 11 on the upper surface of the electrically insulating material 5. An integrated circuit device 13 having a pad 15 thereon is then aligned with the electrically conductive material 9 so that the pad 15 lies over the material 9. The device 13 is then moved toward the base 1 so that the pad 15 is pressed against the lip 11 of the electrically conductive material 9 and deforms the material 9 due to the resiliency of the material 5 as shown in FIG. 2. The electrically insulating material is now permitted to harden if thermoplastic by cooling or is now fully cross-linked by heating if thermosetting, such as butadiene, to provide the final z-axis interface as shown in FIG. 2. The electrically insulating material 5 will also fill the space between the electrically conductive material 9 and the pad 15. It can be seen that any holes in the material 5 will be at a minimum due to the deformation of the electrically conductive material 9. Also, since the coefficient of thermal expansion of the electrically insulating material 5 is greater than that of the electrically conductive material 9, there is a further tendency of the material 3 to retain contact pressure with the material 9 to maintain low contact resistance. In addition, the electrical connection should be superior to that of the prior art since there is deformation of material 9 during pressure bonding to accomodate non-flat circuits.

It should be understood that, though the description has been provided with respect to a single device, such as, for example, a single integrated circuit, the procedure described above can also be used on a wafer basis wherein plural devices are fabricated simultaneously on the same wafer with the above described procedure be applied in the wafer state.

It can be seen that there has been provided a z-axis interface which requires minimal processing steps and overcomes the problems encountered with prior art devices used to perform the same function.

Figure 3:
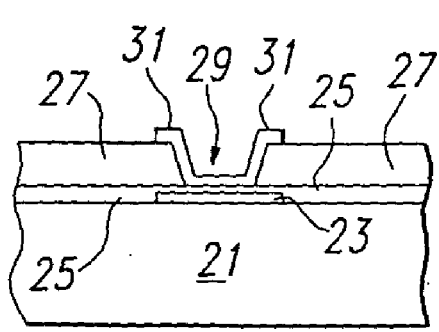
FIG. 3 is a cross sectional view of a partially fabricated second embodiment in accordance with the present invention.
Figure 4:
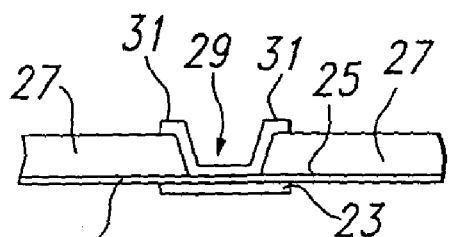
FIG. 4 is a cross sectional view of the completed second embodiment in accordance with the present invention.

Referring now to FIG. 3, there is shown a silicon base 21 having an electrically conductive pad 23 thereon. A layer of gold 25 is deposited on the base 21 and optionally over a pad 23 and is patterned and etched in standard manner. Then a layer of electrically insulative material 27, the same as the material 5 of the first embodiment, is deposited over the base 21 and gold layer 25, patterned and etched as in the first embodiment to provide vias 29 extending to the pads 23. A gold layer 31 is formed along the sidewalls of the via 29 and on the surface of the material 27 as in the first embodiment. The structure of FIG. 3 is then subjected to an etch whereby the silicon base 21 is removed, leaving a free-standing structure as shown in FIG. 4. The free-standing structure of FIG. 4 can now be applied to a printed wiring board, integrated circuit or the like with further processing continuing as in the case of the first embodiment commencing with movement of the device 13 toward the base.

Though the invention has been described with respect to a specific preferred embodiment thereof, many variations and modifications will immediately become apparent to those skilled in the art. It is therefore the intention that the appended claims be interpreted as broadly as possible in view of the prior art to include all such variations and modifications.

I claim:

1. A method of forming a z-axis interface comprising the steps of:
   (a) providing a device having a first electrically conductive pad thereon;
   (b) forming a layer of resilient electrically insulating material, capable of being made rigid, over a surface of said device, said layer of resilient electrically insulating material having a via with sidewalls extending to said first electrically conductive pad;
   (c) forming a layer of electrically conductive material on said sidewalls extending to said first pad and also extending out of said via and over said first layer of electrically insulating material;
   (d) applying under pressure to the portion of said electrically conductive material extending out of said via a second electrically conductive member to deform said electrically conductive material; and
   (e) then causing said electrically insulating material to become rigid.

2. The method of claim 1 wherein said device is one of an integrated circuit or a printed wiring circuit.

3. The method of claim 1 wherein said electrically insulating material is taken from the class consisting of thermoplastic polymers and b-stageable thermosetting polymers.

4. The method of claim 2 wherein said electrically insulating material is taken from the class consisting of thermoplastic polymers and b-stageable thermosetting polymers.

5. The method of claim 1 wherein said electrically conductive material is gold.

6. The method of claim 2 wherein said electrically conductive material is gold.

7. The method of claim 3 wherein said electrically conductive material is gold.

8. The method of claim 4 wherein said electrically conductive material is gold.

9. The method of claim 2 wherein said second pad is a part of one of an integrated circuit or a printed wiring circuit.

10. The method of claim 9 wherein said electrically insulating material is taken from the class consisting of thermoplastic polymers and b-class thermosetting polymers.

11. The method of claim 9 wherein said electrically conductive material is gold.

12. The method of claim 10 wherein said electrically conductive material is gold.

13. The method of claim 1 further including the step of forming an electrically conductive pattern over said layer of resilient electrically insulating material.

14. The method of claim 12 further including the step of forming an electrically conductive pattern over said layer of resilient electrically insulating material.

15. A method of forming a free-standing z-axis interface layer comprising the steps of:
   (a) providing a removable base;

(b) forming a patterned electrically conductive layer on said base;

(c) forming a layer of resilient electrically insulating material, capable of being made rigid, and having a via with sidewalls extending therethrough secured to said electrically conductive layer;

(d) forming a layer of electrically conductive material on said sidewalls extending out of said via and over said electrically insulating material; and (e) removing said removable base.

16. The method of claim 15 wherein said removable base is silicon.

17. The method of claim 15 wherein said electrically conductive material is gold.

18. The method of claim 15 wherein said electrically insulating material is one of a partially thermoset or thermoplastic material.

19. The method of claim 16 wherein said electrically insulating material is one of a b-stageable thermosetting polymer or thermoplastic polymer.

20. The method of claim 17 wherein said electrically insulating material is one of a b-stageable thermosetting polymer or thermoplastic polymer.

* * * * *

UNITED STATES PATENT AND TRADEMARK OFFICE
CERTIFICATE OF CORRECTION

PATENT NO. : 5,740,605
DATED : April 21, 1998
INVENTOR(S) : Peterson

It is certified that error appears in the above-identified patent and that said Letters Patent is hereby corrected as shown below:

Drawings sheets, consisting of Fig. 1 thru Fig. 5, should be deleted and replaced with the drawing sheet, consisting of Fig. 1 thru Fig. 4, as shown on the attached page.

Signed and Sealed this

First Day of February, 2005

JON W. DUDAS
*Director of the United States Patent and Trademark Office*